(12) United States Patent
Yoon et al.

(10) Patent No.: US 6,337,806 B1
(45) Date of Patent: Jan. 8, 2002

(54) SEMICONDUCTOR DEVICE HAVING DATA MULTIPLEXING AND DATA MASKING FUNCTIONS

(75) Inventors: Hong-goo Yoon, Suwon; Jeong-seok Lee, Seongnam, both of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 78 days.

(21) Appl. No.: 09/604,635

(22) Filed: Jun. 27, 2000

(30) Foreign Application Priority Data

Jun. 25, 1999 (KR) .............................. 99-24298

(51) Int. Cl.[7] .............................................. G11C 11/24
(52) U.S. Cl. .................. 365/149; 365/154; 365/189.02; 365/230.03
(58) Field of Search ................................ 365/149, 154, 365/189.02, 230.03

(56) References Cited

U.S. PATENT DOCUMENTS 5,777,942 A * 7/1998 Dosaka et al. ......... 365/230.03

* cited by examiner

*Primary Examiner*—Huan Hoang
(74) *Attorney, Agent, or Firm*—Skjerven Morrill MacPherson LLP; David W. Heid

(57) ABSTRACT

A semiconductor device having data multiplexing and data masking functions is provided. The semiconductor device includes a dynamic random access memory (DRAM) cell array for inputting or outputting M×N data signals in parallel, a logic circuit having a control function, and a memory unit connected between the DRAM cell array and the logic circuit. The memory unit transmits or receives M×N data signals to or from the DRAM cell array and transmits or receives M data signals to or from the logic circuit, in response to an address signal input from the outside. The memory unit includes at least M memory blocks. Each memory block receives N data signals from the DRAM cell array and transmits at least one data signal to the logic circuit, and receives at least one data signal from the logic circuits and transmits N data signals to the DRAM cell array. A write/read word line driver connects to the at least M memory blocks. The write/read word line driver decodes the address signal, selectively controls writes of data input from the DRAM cell array and the logic circuit to each memory block, and selectively controls reads of data stored in each memory block to transmit the data to the DRAM cell and the logic circuit.

6 Claims, 4 Drawing Sheets

SEMICONDUCTOR DEVICE HAVING DATA MULTIPLEXING AND DATA MASKING FUNCTIONS

BACKGROUND OF THE INVENTION

1. Field of the Invention

The present invention relates to semiconductor devices, and more particularly, to a merged memory-logic semiconductor device having a memory and a logic circuit.

2. Description of the Related Art

Merged memory-logic semiconductor devices include a dynamic random access memory (DRAM) and a logic circuit in a single semiconductor chip. To improve the functions of merged memory-logic semiconductor devices, a static random access memory (SRAM) may be included between the DRAM and the logic circuit. In this case, the capacity of the DRAM is large, and the capacity of the SRAM is small. The number of input/output lines of a DRAM is increased to increase the bandwidth of a merged memory-logic semiconductor device. Correspondingly, the number of input/output lines of an SRAM is increased. However, the size of a merged memory-logic semiconductor device increases as the number of input/output lines of the SRAM therein increases. To reduce the number of input output lines, a device can include a multiplexer for selecting, for example, M data signals (e.g., bits) at a time from among M×N data signals output from a DRAM and transmitting the M selected data signals to a logic circuit. An SRAM could perform the function of a multiplexer, but the SRAM would need to provide a data masking function to appropriately control the transmission of data between a DRAM and a logic circuit.

SUMMARY OF THE INVENTION

To solve the above problems, an embodiment of the present invention provides a semiconductor device having a memory unit for performing a multiplexing function between a dynamic random access memory (DRAM) and a logic circuit. The memory unit also performs a masking function between the DRAM and the logic circuit.

One specific embodiment of the present invention is a semiconductor device includes DRAM cell array, a logic circuit, and a memory unit. The DRAM cell array inputs or outputs M×N data signals in parallel. The logic circuit has a control function, and the memory unit is connected between the DRAM cell array and the logic circuit. The memory unit transmits or receives M×N data signals to or from the DRAM cell array and transmits or receives M data signals to or from the logic circuit, in response to an input address signal. The memory unit includes at least M memory blocks. Each memory block receives N data signals from the DRAM cell array and transmits at least one of the N data signals to the logic circuit. Each memory block can also receive at least one data signal from the logic circuits and transmit N data signals to the DRAM cell array. A write/read word line driver is connected to the at least M memory blocks. The write/read word line driver decodes the address signal, selectively writes data input from the DRAM cell array and the logic circuit to each memory block, and selectively reads data stored in each memory block to transmit the data to the DRAM cell and the logic circuit.

Another embodiment of the present invention is also a semiconductor device including a dynamic random access memory (DRAM) cell array for inputting or outputting M×N data signals in parallel, a logic circuit having a control function, and a memory unit connected between the DRAM cell array and the logic circuit. The memory unit transmits or receives M×N data signals to or from the DRAM cell array and transmits or receives M data signals to or from the logic circuit, in response to an address signal input from the outside. The memory unit includes a plurality of write word line drivers for decoding an address signal for writing data to the memory unit, a plurality of read word line drivers for decoding an address signal for reading data from the memory unit, and at least M memory blocks. Each of the M memory blocks includes N memory cells, writes the N data signals transmitted in parallel from the DRAM cell array to the N memory cells, and writes at least one data signal transmitted from the logic circuit to the N memory cells under control of some of the outputs of the plurality of write word line drivers. Each of the M memory blocks also selects at least one data signal from among N data signals stored in the N memory cells and transmits the selected data signal to the logic circuit. Each memory block also transmits the N data signals to the DRAM cell array in parallel under control of some of the outputs of the plurality of read word line drivers.

Accordingly, the memory unit multiplexes data signals output from the DRAM cell array and masks data signals output from the logic circuit.

BRIEF DESCRIPTION OF THE DRAWINGS

The features and advantages of the present invention will become more apparent by describing in detail an exemplary embodiment thereof with reference to the attached drawings in which.

In the drawings, the same reference symbol used in different drawings denotes the same or similar elements.

DETAILED DESCRIPTION OF THE INVENTION

Hereinafter, embodiments of the present invention will be described in detail with reference to the attached drawings.

Figure 1:
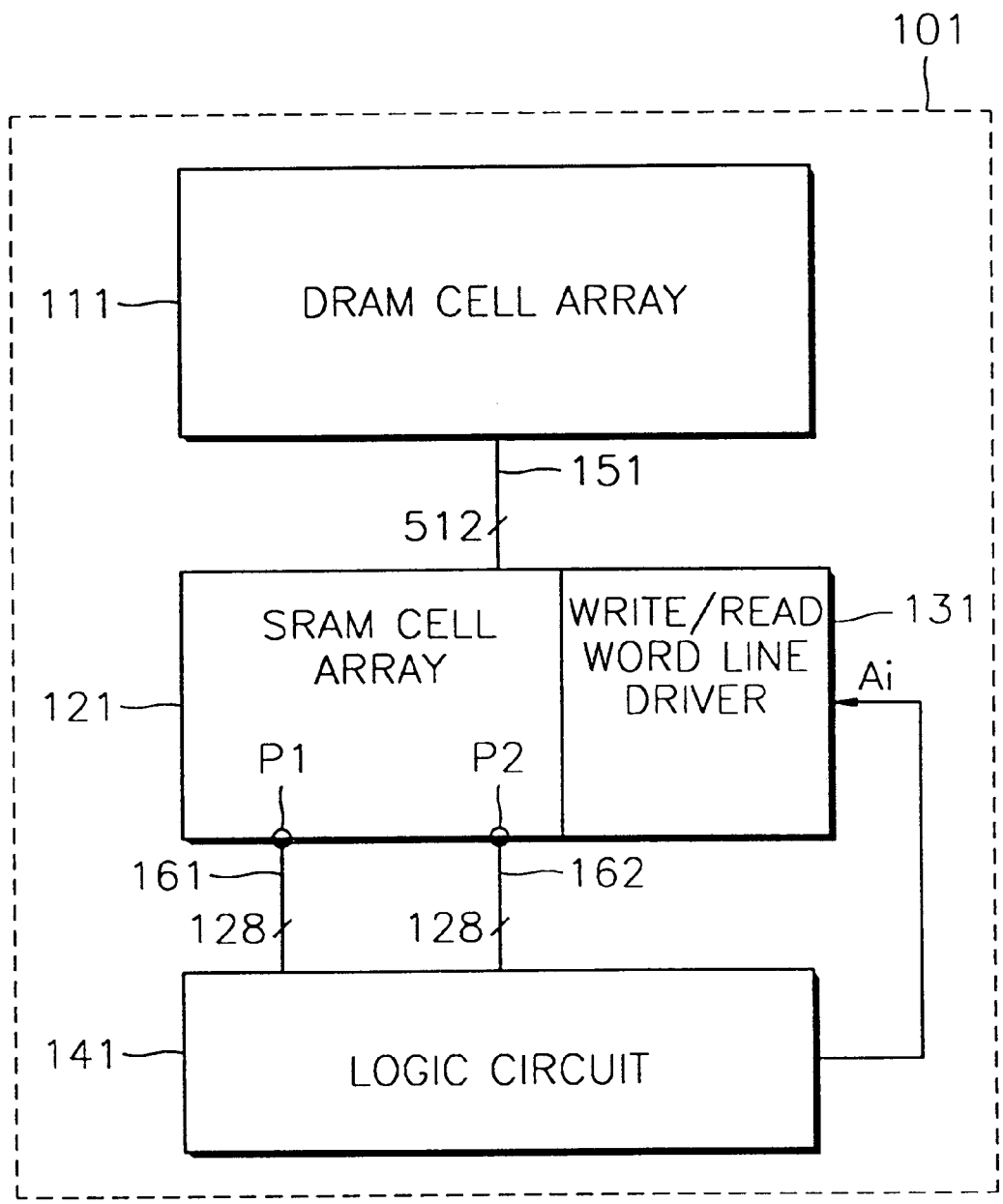
FIG. 1 is a block diagram of a merged memory-logic semiconductor device according to an embodiment of the present invention.

Referring to FIG. 1, a semiconductor device 101 according to an embodiment of the present invention includes a dynamic random access memory (DRAM) cell array 111, a memory unit 121, a write/read word line driver 131, and a logic circuit 141. The memory unit 121 includes a static random access memory (SRAM) cell array in the exemplary embodiment of FIG. 1, but may alternatively employ various other memories.

The DRAM cell array 111 transmits and receives data signals to and from the SRAM cell array 121 via M×N, for example, 512(128×4), data input/output lines 151. In other words, during an operation reading data from the DRAM cell array 111, the DRAM cell array 111 transmits 512 data signals to the SRAM cell array 121 in parallel, via the 512 data input/output lines 151. During a process writing to the DRAM cell array 111, the DRAM cell array 111 receives 512 data signals in parallel from the SRAM cell array 121, via the 512 data input/output lines 151.

The SRAM cell array 121 is connected to the logic circuit 141 via two groups of M data input/output lines 161 and 162. In the exemplary embodiment, M is 128. The SRAM cell array 121 includes first and second ports P1 and P2, and transmits and receives data to and from the logic circuit 141 via the first and second ports P1 and P2. When the SRAM cell array 121 transmits or receives data to or from the logic circuit 141 via the first port P1, the second port P2 is in a standby mode. Alternately, when the SRAM cell array 121 transmits or receives data to or from the logic circuit 141 via the second port P2, the first port P1 is in a standby mode.

Hence, the SRAM cell array 121 receives 512 data signals from the DRAM cell array 111 in parallel and transmits 128 data signals from among the 512 received data signals to the logic circuit 141 in parallel. The SRAM cell array 121 thus multiplexes the data signals from the DRAM cell array 111 into the logic circuit 141.

The write/read word line driver 131 decodes an address signal Ai received from the logic circuit 141 and provides the decoded address signal Ai to the SRAM cell array 121. The write/read word line driver 131 is further described below with reference to FIG. 2.

In FIG. 1, the number of data input/output lines 151 between the DRAM cell array 111 and the SRAM cell array 121 is 512, and the number of data input/output lines 161 or 162 in each group between the SRAM cell array 121 and the logic circuit 141 is 128. However, the number of data input/output lines 161 or 162 may be decreased or increased depending on the characteristics of the semiconductor device 101.

Figure 2:
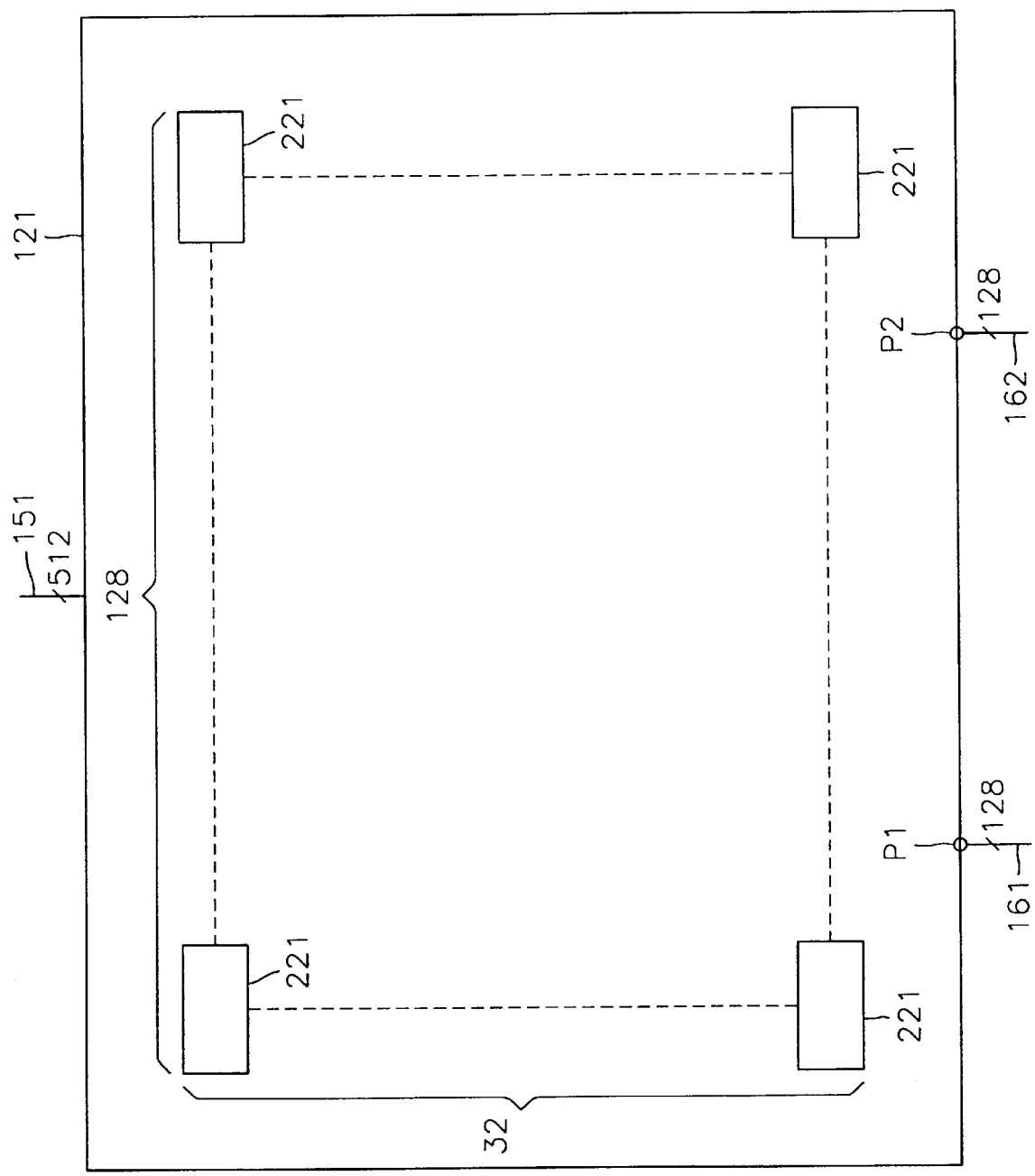
FIG. 2 is an internal block diagram of the static random access memory (SRAM) of FIG. 1.

Referring to FIG. 2, the SRAM cell array 121 includes 128×32 memory blocks 221. Each row contains 128 memory block 221 to easily output 128 data signals to the logic circuit 141 of FIG. 1 in parallel. 32 memory blocks 221 are in each column in this embodiment, but the number of memory blocks disposed in each column may vary depending on a user's demands and/or the function of the logic circuit 141. As the number of the memory blocks 221 in each column increases, the amount of data stored in the SRAM cell array 121 and therefore, the size of the SRAM cell array 121 increase, and the length of an address signal for designating a row of memory blocks 221 increases.

Figure 3:
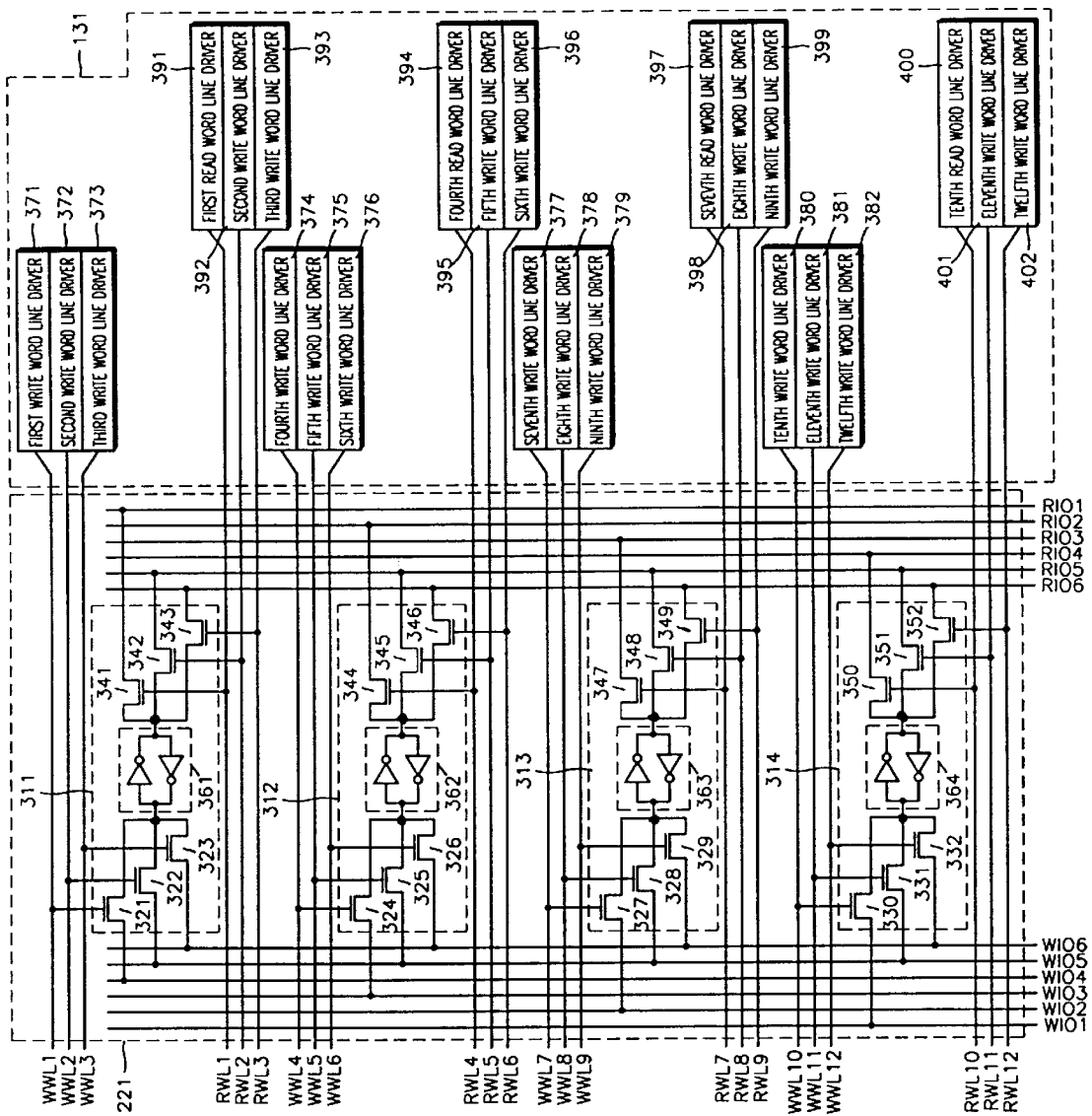
FIG. 3 shows one memory block among the plurality of memory blocks of FIG. 2 and circuitry of the write read word line driver of FIG. 1.

FIG. 3 illustrates the structure and operation of one of memory blocks 221 of FIG. 2. Referring to FIG. 3, the memory block 221 includes first through fourth memory cells 311–314, first through twelfth write word lines WWL1–WWL12, first through twelfth read word lines RWL–RWL12, first through sixth input lines WIO1–WIO6, first through sixth output lines RIO1–RIO6, write word line drivers 371–382, and read word line drivers 391–402. Data output from the DRAM cell array 111 of FIG. 1 is input to the memory cells 311–314 via first through fourth input lines WIO1–WIO4, and data output from the logic circuit 141 of FIG. 1 is input to the memory cells 311–314 via the input lines WIO5 and WIO6. Data output from the memory cells 311–314 is transmitted to the DRAM cell array 111 via the first through fourth output lines RIO1–RIO4, and data output from the memory cells 311–314 is transmitted to the logic circuit 141 via the fifth and sixth output lines RIO5 and RIO6. The memory cells 311–314 include NMOS transistors 321–332, latch circuits 361–364, and NMOS transistors 341–352.

Each of the NMOS transistors 321–332 has a gate connected to a respective one of the first through twelfth write word lines WWL1–WWL12 and connects to an associated one of the first through sixth input lines WIO1–WIO6. Accordingly, when the first through twelfth write word lines WWL1–WWL12 are activated, the NMOS transistors 321–332 transmit data input via the first through sixth input lines WIO1–WIO6 to the latch circuits 361–364. The first, fourth, seventh and tenth write word lines WWL1, WWL4, WWL7 and WWL10 are always activated simultaneously. Accordingly, the data input from the DRAM cell array via the first through fourth input lines WIO1–WIO4 are simultaneously written to the latch circuits 361–364, respectively, via the NMOS transistors 321, 324, 327 and 330, respectively. The second, fifth, eighth and eleventh write word lines WWL2, WWL5, WWL8 and WWL11 are separately activated according to an address signal Ai output from the logic circuit 141 of FIG. 1. A data signal input via the fifth input line WIO5 is selectively transmitted to one of the latch circuits 361–364 via the respective NMOS transistors 322, 325, 328 and 331, according to which one of write word lines WWL2, WWL5, WWL8 and WWL11 is activated. Similarly, the third, sixth, ninth and twelfth write word lines WWL3, WWL6, WWL9 and WWL12 are separately activated according to the address signal Ai. A data signal input via the sixth input line WIO6 is transmitted to one of the latch circuits 361–364 via the respective NMOS transistors 323, 326, 329 and 332, according to which one of write word lines WWL3, WWL6, WWL9 and WWL12 is activated.

The latch circuits 361–364 invert and store data signals transmitted via the NMOS transistors 321–332. Each of the latch circuits 361–364 includes two inverters. One of the inverters has a driving capacity that is larger than that of the other inverter. Because the loads on the first through sixth output lines RIO1–RIO6 can be large when data is output, the latch circuits 361–364 use the inverter having the largest driving capacity to provide the output data signal during the data read operation of the device. During a write operation, the output signal of the inverter having the smaller driving capacity is easily reversed when the write operation changes a data value in one of the memory cells 311–314. Accordingly, the SRAM according to the present invention has a structure that is simpler than the structure of a typical SRAM and is easier to manufacture, thereby greatly reducing the manufacturing cost. Co-filed U.S. Pat. App. Ser. No. Unknown, Attorney Docket No. AB-997 U.S., further describes a suitable SRAM and is hereby incorporated by reference in its entirety.

Each of the NMOS transistors 341–352 has a gate connected to a respective one of the first through twelfth read word lines RWL1–RWL12 and is connected to an associated one of the first through sixth output lines RIO1–RIO6. Accordingly, when the first through twelfth read word lines RWL1–RWL12 are activated, the NMOS transistors 341–352 load data stored in the latch circuits 361–364 onto the first through sixth output lines RIO1–RIO6. The first, fourth, seventh and tenth read word lines RWL1, RWL4, RWL7 and RWL10 are always turned on simultaneously. Accordingly, the data in the latch circuits 361–364 are respectively loaded onto the first through fourth output lines RIO1–RIO4 via the NMOS transistors 341, 344, 347 and 350, respectively. On the other hand, the second, fifth, eighth and eleventh read word lines RWL2, RWL5, RWL8 and RWL11 are separately activated according to the address signal Ai. Accordingly, the NMOS transistors 342, 345, 348 and 351 are separately turned on, and the address signal Ai selects which of the data values stored in the latch circuits 361–364 is loaded onto the fifth output line RIO5. Similarly, the third, sixth, ninth and twelfth read word lines RWL3, RWL6, RWL9 and RWL12 are separately activated according to the address signal Ai, and the address signal Ai controls which one of the data values stored in the latch circuits 361–364 is loaded onto the sixth output line RIO6 via the NMOS transistors 343, 346, 349 or 352.

In writing data from the DRAM cell array 111 of FIG. 1 to the memory block 221, the DRAM cell array 111 loads data onto the first through fourth input lines WIO1–WIO4. The logic circuit 141 of FIG. 1 applies an address signal Ai for selecting a row of memory blocks 221. In response to the address signal Ai selecting the row containing the memory block 221 to received data from the DRAM cell array 111, the first, fourth, seventh and tenth write word line drivers 371, 374, 377 and 380 activate the first, fourth, seventh and tenth write word lines WWL1, WWL4, WWL7 and WWL10. Accordingly, the NMOS transistors 321, 324, 327 and 330 simultaneously turn on, and thus the latch circuits 361–364 store data received via the NMOS transistors 321, 324, 327 and 330, from the first through fourth input lines WIO1–WIO4, respectively.

In writing data output from the logic circuit 141 of FIG. 1 to the memory block 221, the logic circuit 141 writes data to the memory block 221 via the first port P1 or the second port P2. In writing data via the first port P1, the data output from the logic circuit 141 is loaded onto the fifth input line WIO5, which is connected to the first port P1. The logic circuit 141 generates an address signal Ai to select a row of memory blocks 221 and to activate one among the second, fifth, eighth and eleventh write word lines WWL2, WWL5, WWL8 and WWL11. For example, the address signal Ai can select the second write word line driver 372, which activates the write word line WWL2 and turns on the NMOS transistor 322. With the NMOS transistor 322 turned on, the data on the fifth input line WIO5 is stored in the latch circuit 361. In the same manner, address signals Ai could activate the fifth, eighth and eleventh write word lines WWL5, WWL8 and WWL11 to store the data on the fifth input line WIO5 in the respective latch circuits 362, 363 and 364 via the NMOS transistors 325, 328 and 331, respectively. The data on the sixth input line WIO6 is stored in the latch circuits 361–364 via the NMOS transistors 323, 326, 329 and 332, respectively in the same manner as the data on the fifth input line WIO5 is written to the latch circuits 361–364.

As described above, data from the logic circuit 141 is only written to a memory cell selected by an address signal Ai. This means that data written from the logic circuit 141 to the memory block 221 is controlled by an address signal Ai so as to be exactly masked. In the same manner as described above, data is simultaneously written to all the memory blocks in a row of the SRAM cell array 121.

In reading data stored in the memory block 221 and transmitting the data to the DRAM cell array 111, the logic circuit 141 applies an address signal Ai for selecting a row of memory blocks 221 and simultaneously activating the first, fourth, seventh and tenth read word line drivers 391, 394, 397 and 400 in the selected row. Then, the first, fourth, seventh and tenth read word line drivers 391, 394, 397 and 400 activate the first, fourth, seventh and tenth read word lines RWL1, RWL4, RWL7 and RWL10. Accordingly, the NMOS transistors 341, 344, 347 and 350 turn on simultaneously, and thus data stored in the latch circuits 361–364 are loaded onto the first through fourth output lines RIO1–RIO4 via the NMOS transistors 341, 344, 347 and 350. The data loaded onto the first through fourth output lines RIO1–RIO4 are transmitted to the DRAM cell array 111 of FIG. 1.

In reading data value stored in the memory block 221 and transmitting the data value to the logic circuit 141 of FIG. 1, the logic circuit 141 generates an address signal Ai for designating a row of memory blocks 221 and one of the memory cells 311–314. For example, when reading data stored in the memory cell 311, the address signal Ai selects and activates the second or third read word line driver 392 or 393. When the second read word line driver 392 is activated, the second read word line RWL2 is activated, and thus the NMOS transistor 342 is turned on. Once the NMOS transistor 342 is turned on, the data value stored in the latch circuit 361 is loaded onto the fifth output line RIO5 via the NMOS transistor 342. The data value loaded onto the fifth output line RIO5 is transmitted to the logic circuit via the first port P1. In the same manner, the address signal Ai can separately activate the fifth, eighth and eleventh read word lines RWL5, RWL8 and RWL11 to turn on the NMOS transistors 345, 348 and 351 and thus transfer data stored in the latch circuits 362–364 onto the fifth output line RIO5, which is connected to the first port P1. Similarly, a data value stored in one of the latch circuits 361–364 is loaded onto the sixth output line RIO6 via the NMOS transistor 343, 346, 349 or 352 so as to be transmitted to the logic circuit 141 via the second port P2.

Data stored in the latch circuits 361–364 is selectively read according to the address signal Ai from the logic circuit 141 of FIG. 1 for data sent to the logic circuit 141. Accordingly, the memory block 221 multiplexes four data output signals from the DRAM cell array 111 to transmit one of the data signals to the logic circuit 141.

Figure 4A:
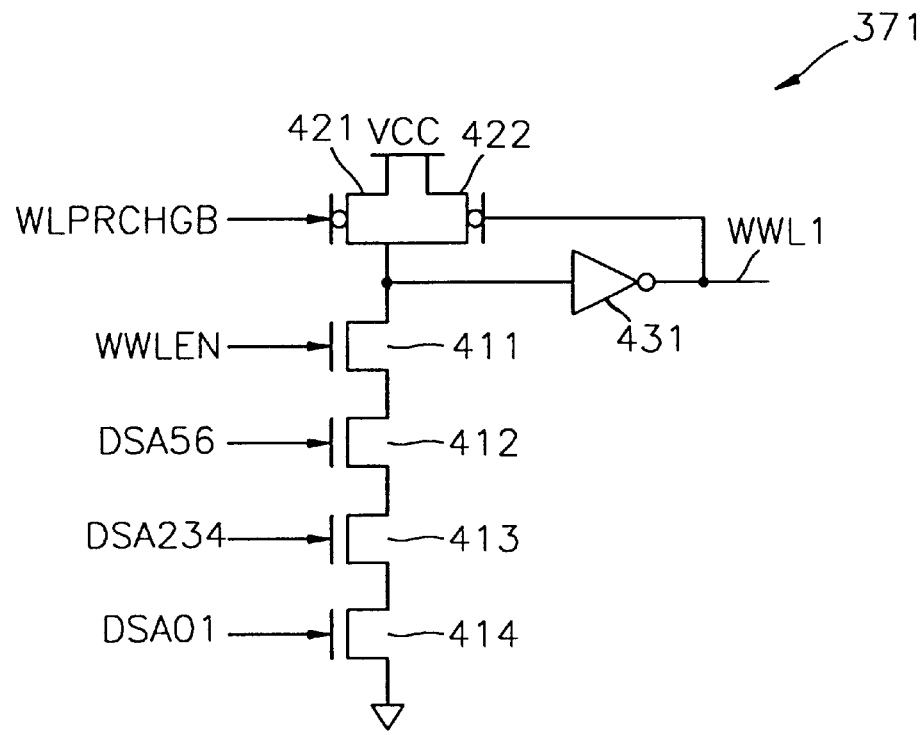
FIG. 4A is a circuit diagram of the first write word line driver of FIG. 3.

FIG. 4A illustrates an embodiment of the first write word line driver 371 of FIG. 3. This embodiment of the write word line driver 371 includes PMOS transistors 421 and 422, NMOS transistors 411–414 and an inverter 431. The NMOS transistors 411–414 are gated by a write word line enable signal WWLEN and decoded address signals DSA56, DSA234 and DSA01, respectively from a decoder (not shown). When the write word line enable signal WWLEN and the address signals DSA56, DSA234 and DSA01 are at logic high levels, the transistors 411–414 turn on and pull in the input terminal of the inverter 431 to a logic low level, and thus inverter 431 activates the first write word line WWL1 to the level of the power supply voltage VCC. When at least one among the write word line enable signal WWLEN and the address signals DSA01, DSA234 and DSA56 is at a logic low level and a word line precharge signal WLPRCHGB is at a logic low level, the PMOS transistor 421 pulls the input terminal of inverter 421 up to the supply voltage Vcc, and the first write word line WWL1 is deactivated.

The structure and operation of the second through twelfth write word line drivers 372–382 are the same as those of the first write word line driver 371, except that the decoded address signal DS56 differs for different write word line drivers. In particular, the decoded address signals DSA01 and DSA234 are for selecting one of the 32 rows of memory blocks 221 of FIG. 2 and are the same for all write word line drivers 372–382 in a row of memory blocks 221. The decoded address signal DSA56 is the same for write word line drivers 371, 374, 377, and 380 and activated for write word line drivers 371, 374, 377, and 380 when write input lines WOI1 to WOI4 are receiving data (e.g., from the DRAM cell array 111 of FIG. 1). The decoded address signal DSA56 differs for write word line drivers 372, 373, 375,376, 378,379,381, and 382. In particular, when receiving data from port P1 (i.e., line WIO5), the decoded address signal DSA56 is activated for one of four word line drivers 372, 375, 378, and 381 depending on the least significant bits of the address signal Ai. When receiving data from port P2 (i.e., line WIO6), the decoded address signal DSA56 is activated for one of four word line drivers 373, 376, 379, and 382 depending on the least significant bits of the address signal Ai.

Figure 4B:
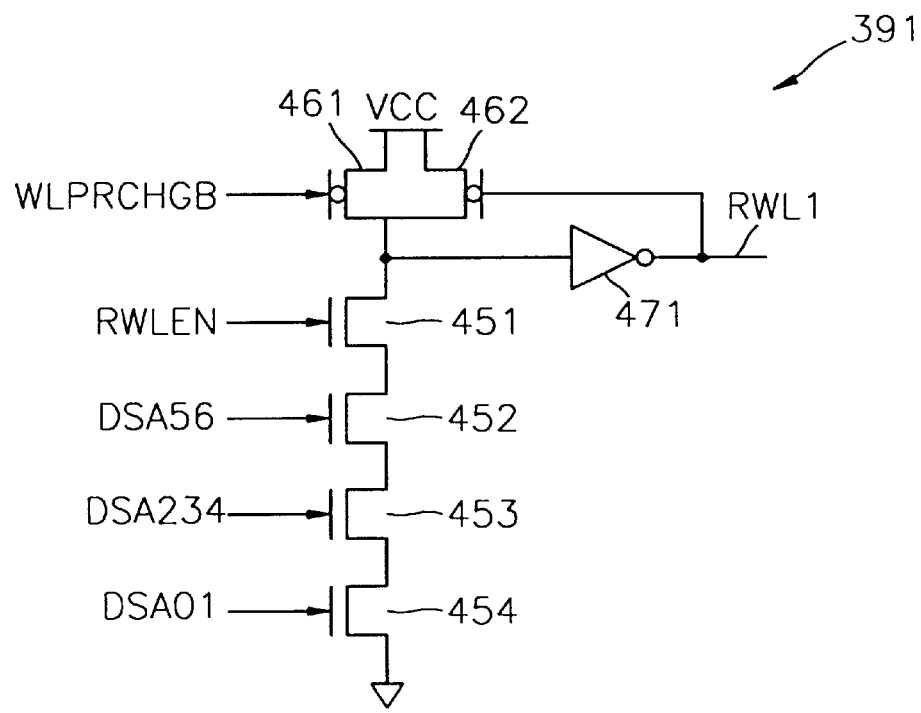
FIG. 4B is a circuit diagram of the first read word line driver of FIG. 3.

FIG. 4B shows an embodiment of the first read word line driver 391. This embodiment of the read word line driver 391 includes PMOS transistors 461 and 462, NMOS transistors 451–454 and an inverter 471. The structure and operation of the first read word line driver 391 is the same as those of the first write word line driver 371 of FIG. 4A, with the exception that a read word line enable signal RWLEN is applied to the NMOS transistor 451 and the output of the inverter 471 is transmitted to the first read word line RWL1. Thus, further descriptions thereof will be omitted. The structure and operation of the second through twelfth read word line drivers 392–402 are the same as those of the first read word line driver 391.

According to the embodiment of the present invention as described above, the SRAM cell array 121 multiplexes M×N data signals output from the DRAM cell array 111 of FIG. 1, and thus M data signals are transmitted to the logic circuit 141 at one time. In addition, the logic circuit 141 selectively writes data to one among the memory cells 311–314 of each memory block in a row of the SRAM cell array 121 using the address signal Ai to distinguish among memory cells in the memory block, thereby exactly performing the write masking function.

The drawings and specification have illustrated exemplary embodiments of the invention, and although specific terms are employed, those terms are used in a generic and descriptive sense only and not for the purpose of limitation, the scope of the invention being set forth in the following claims. Various changes in form and details may be made therein without departing from the spirit and scope of the invention as defined by the appended claims.

What is claimed is:

1. A semiconductor device comprising:
   a dynamic random access memory (DRAM) cell array capable of inputting or outputting M×N data signals in parallel;
   a logic circuit having a control function; and
   a memory unit connected between the DRAM cell array and the logic circuit, wherein the memory unit transmits or receives M×N data signals to or from the DRAM cell array and transmits or receives M data signals to or from the logic circuit, in response to an address signal, wherein the memory unit comprises:
      at least M memory blocks each for receiving N data signals from the DRAM cell array and transmitting at least one data signal to the logic circuit, and for receiving at least one data signal from the logic circuits and transmitting N data signals to the DRAM cell array; and
      a write/read word line driver connected to the at least M memory blocks, wherein the write/read word line driver decodes the address signal, selectively activates operations that write the data signals input from the DRAM cell array and the logic circuit to the memory blocks, and selectively activates operations that read of each memory block to transmit the data signals to the DRAM cell and the logic circuit.

2. The semiconductor device of claim 1, wherein the write/read word line driver comprises:
   a plurality of write word line drivers connected to the at least M memory blocks, respectively, wherein each of the write word line drivers decodes the address signal and selectively writes the data input from the DRAM cell array and the logic circuit to each memory block; and
   a plurality of read word line drivers connected to the at least M memory blocks, respectively, wherein each of the read word line drivers decodes the address signal and selectively reads the data stored in each memory block to transmit it to the DRAM cell array and the logic circuit.

3. The semiconductor device of claim 1, wherein the memory unit comprises first and second ports to transmit and receive data to and from the logic circuit, each of the first and second ports comprising M data input/output lines.

4. A semiconductor device comprising:
   a dynamic random access memory (DRAM) cell array capable of inputting or outputting M×N data signals in parallel;
   a logic circuit having a control function; and
   a memory unit connected between the DRAM cell array and the logic circuit, wherein the memory unit transmits or receives M×N data signals to or from the DRAM cell array and transmits or receives M data signals to or from the logic circuit, in response to an address signal, wherein the memory unit comprises:
      a plurality of write word line drivers for decoding an address signal for writing data to the memory unit;
      a plurality of read word line drivers for decoding an address signal for reading data to the memory unit; and
      at least M memory blocks, wherein each of the M memory blocks comprises N memory cells, selectively writes the N data signals transmitted in parallel from the DRAM cell array to the N memory cells and at least one data signal transmitted from the logic circuit to at least one of the N memory cells under control of some of the outputs of the plurality of write word line drivers, and selectively transmits at least one value among N data values stored in the N memory cells to the logic circuit and the N data values to the DRAM cell array in parallel under control of some of the outputs of the plurality of read word line drivers.

5. The semiconductor device of claim 4, wherein the memory unit comprises first and second ports to transmit and receive data to and from the logic circuit, each of the first and second ports comprising M data input/output lines.

6. The semiconductor device of claim 4, wherein the semiconductor device is a merged memory-logic semiconductor device.

* * * * *